United States Patent [19]
Menkhoff et al.

[11] Patent Number: 5,699,005
[45] Date of Patent: Dec. 16, 1997

[54] CLOCK GENERATOR FOR GENERATING A SYSTEM CLOCK CAUSING MINIMAL ELECTROMAGNETIC INTERFERENCE

[75] Inventors: Andreas Menkhoff, Freiburg; Ulrich Theus, Gundelfingen, both of Germany

[73] Assignee: Deutsche ITT Industries GmbH, Freiburg, Germany

[21] Appl. No.: 563,173

[22] Filed: Nov. 27, 1995

[30] Foreign Application Priority Data

Nov. 30, 1994 [DE] Germany .............. 44 42 403.5

[51] Int. Cl.⁶ .................................................. H03K 1/04
[52] U.S. Cl. .................................... 327/292; 327/299
[58] Field of Search ................................ 327/292, 299

[56] References Cited

U.S. PATENT DOCUMENTS

| | | | |
|---|---|---|---|
| 4,023,116 | 5/1977 | Alfke et al. | 331/17 |
| 4,507,796 | 3/1985 | Stumfall | 375/106 |
| 4,933,890 | 6/1990 | Nuykens et al. | 364/721 |
| 5,442,664 | 8/1995 | Rust et al. | 375/371 |

FOREIGN PATENT DOCUMENTS

| | | |
|---|---|---|
| 0163313 | 12/1985 | European Pat. Off. . |
| 0416423 | 3/1991 | European Pat. Off. . |
| 3802863 | 2/1988 | Germany . |
| 4142563 | 12/1991 | Germany . |
| 4423074 | 6/1994 | Germany . |

*Primary Examiner*—Margaret Rose Wambach
*Attorney, Agent, or Firm*—Plevy & Associates

[57] ABSTRACT

A clock generator circuit for clock controlled electronic devices, which causes minimal electromagnetic interference in adjacent electronic equipment. The clock generator circuit includes a clock source for generating a basic clock signal having a predetermined frequency. The basic clock signal defines a reference clock signal having a period T. A phase modulator coupled to the clock source for producing a system clock signal by delaying the basic clock signal. A signal source coupled to the phase modulator, which controls the phase modulator so that the system clock signal is delayed with respect to the reference clock signal by a time period less than half of the period T of the reference clock signal.

19 Claims, 2 Drawing Sheets

CLOCK GENERATOR FOR GENERATING A SYSTEM CLOCK CAUSING MINIMAL ELECTROMAGNETIC INTERFERENCE

BACKGROUND OF THE INVENTION

1. Field of the Invention

The present invention relates to a clock generator circuit. More particularly, the present invention relates to a clock generator circuit for generating a system clock for clock-controlled electronic devices, which minimizes electromagnetic interference in nearby electronic equipment.

2. Description of the Prior Art

The use of digital signal-processing devices which are clock-controlled has increased in various applications for displaying or controlling diverse functions, particularly in motor vehicles. These clock controlled devices require a centralized or decentralized clock system, to which the individual clock-controlled devices are connected. As a result of the clock systems, interference signals are produced directly, or via the connected supply or signal lines in a wide frequency range.

The interference signals may propagate to nearby electronic devices or equipment via electromagnetic interference fields. The interference signals may also propagate via a relatively high-resistance supply network, and interfere with the operation of such devices or equipment. This interference is particularly disturbing to analog sub-circuits or signals. In motor vehicles, the audio equipment (broadcast receiver, mobile-radio unit, cassette player) is particularly affected, but analog sensors also contained within motor vehicles can be affected.

Clock-induced interference is caused by current peaks or pulses developed within the clock-controlled device which are locked to one or both pulse edges of the system clock. These current peaks are produced by the activation of a great number of switching stages, e.g., by the charging or discharging of gate capacitances in MOS circuits. The higher the clock frequency, the faster the internal switching operations must be performed, which produces larger current peaks. The number of switching stages to be activated and thus, the height of the current peaks, increase with increasing circuit complexity, particularly if the associated clock-controlled devices or processors are implemented in CMOS technology.

The interference effects of the above mentioned current peaks are suppressed to some extent by external blocking capacitors. However, the blocking capacitors utilized for this purpose cannot suppress the high frequency components due to cost reasons and the limitations of packaging designs for integrated circuits.

Some methods are known in the art for modifying a clock system to reduce interference to adjacent electronic equipment. For example, reference DE-A-41 42 563 discloses a clock generator which modulates the system clock by means of a phase/frequency modulator. The modulator is an electronically controlled leakage-current path which modulates the VCO control voltage, wherein the controlled leakage current has a sawtooth, triangular, sinusoidal or other wave form. The phase or frequency modulation is effected depending on the design of the phase-locked loop and on the maximum amplitude of the leakage current.

Reference DE-A-38 02 863 discloses a device that reduces clock-induced interference effects by a pure frequency modulation of the system clock. Particularly attention being directed to the respective modulation frequency and the respective frequency deviation with regard to the frequency range in which interference is to be suppressed.

Reference DE-A-44 23 074 discloses a device that reduces clock-induced interference effects by switching the output signal from a clock generator between at least two division ratios by means of a frequency divider to obtain a clock signal which is stable in frequency. The switching of the frequency divider is effected by a pseudo-random number generator.

U.S. Pat. No. 4,023,116 to Alfke et al., entitled PHASE-LOCKED LOOP FREQUENCY SYNTHESIZER, issued on May 10, 1977, discloses a frequency synthesis system whose output clock is locked to a reference clock via a phase-locked loop. As the phase comparison is only possible during the pulse edges of the reference clock, the time interval between the pulse edges acts on the phase/frequency control as a "dead band". During the dead-band interval, the frequency synthesis system is unregulated, so that small, unregulated variations may occur in the period of the output signal as unwanted phase differences. The dead band is eliminated by means of suitable circuitry, thus reducing frequency jitter of the synthesized output signal.

The prior art clock generators use methods which reduce the main spectral lines of the interfering system by distributing their energy content to further spectral lines. However, the inventors have analyzed the resulting signal spectra and found that the amount of interference suppression achieved by these methods is inadequate. These methods do not prevent individual spectral lines from having considerably higher amplitudes than the remaining spectral lines, so that interference suppression is limited. These spectral lines are caused by periodic signal components in the modulating signal itself, e.g., in the case of triangular or sawtooth modulation, or by a modulation component which is not periodical, e.g., a pseudo-random number sequence, but in which the number of additional spectral lines is too small and positioned unfavorable.

It is therefore, an object of the present invention to provide an improved clock generator for generating a system clock which has an interfering spectrum and radiated energy distributed as evenly as possible to many spectral lines in order to substantially minimize electromagnetic interference.

SUMMARY OF THE INVENTION

A clock generator circuit for clock controlled electronic devices, which causes minimal electromagnetic interference in adjacent electronic equipment. The clock generator circuit includes a clock source for generating a basic clock signal having a predetermined frequency. The basic clock signal defines a reference clock signal having a period T. A phase modulator is coupled to the clock source for producing a system clock signal by delaying the basic clock signal. A signal source is coupled to the phase modulator for controlling the phase modulator so that the system clock signal is delayed with respect to the reference clock signal by a time period less than half of the period T of the reference clock signal.

BRIEF DESCRIPTION OF THE DRAWING

The above objects, further features and advantages of the invention are described in detail below in conjunction with the drawings, of which.

DETAILED DESCRIPTION OF THE DRAWING

Generally the clock generator circuit of the present invention employs phase modulation to generate a system clock signal for clock-controlled electrical devices, which induces a minimum amount of interference in nearby electrical equipment or devices. The circuit parameters of the clock generator of the present invention are derived by analyzing the current pulse wave forms i1 & i2 shown in FIG. 1. Current pulses i1 represent a phased-locked current pulses, which are generated within a clock-controlled electrical device by a system clock signal that is not phase shifted. Current pulses i2 represent phase-modulated current pulses, which are generated by a system clock signal that is phase shifted according to the present invention.

Figure 2:
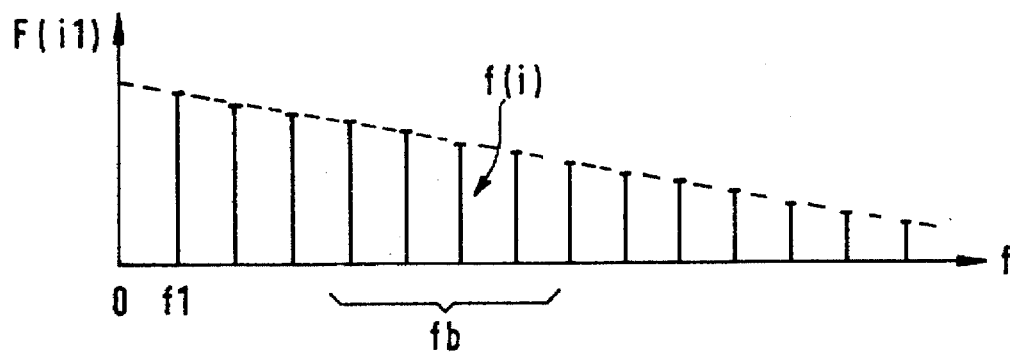
FIG. 2 is a frequency spectrum diagram of the prior art phase locked current pulses.
Figure 3:
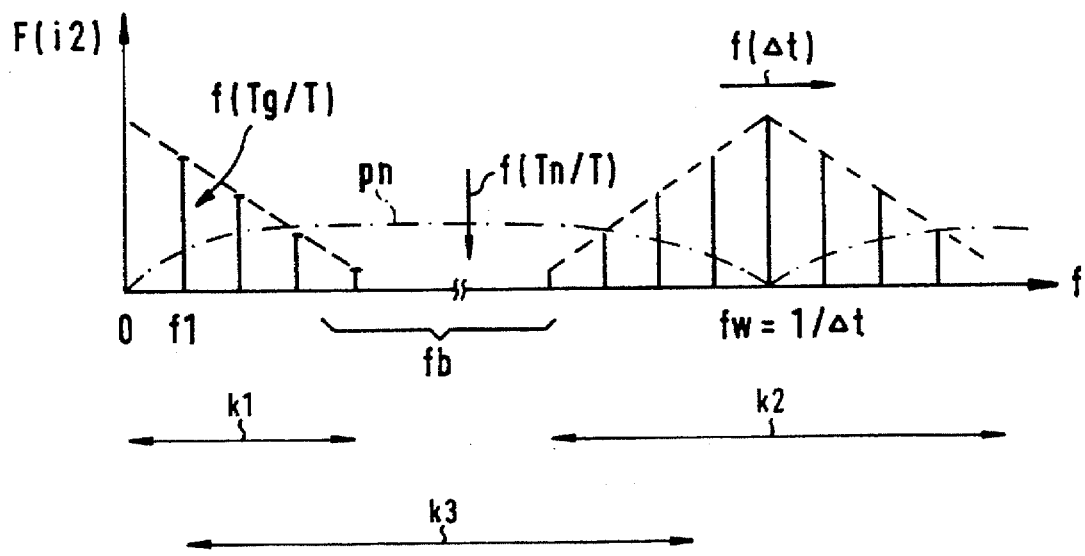
FIG. 3 is a frequency spectrum diagram of the phase shifted current pulses according to the present invention.

The signal spectra of currents i1 & i2 were analyzed in terms of their fourier components, wherein the following interdependencies are obtained for the resulting spectra. For simplicity it is assumed that the individual current pulses i1 and i2 are so narrow that their interfering spectra extend into a frequency range which is greater than the frequency of the associated reference clock b1 of FIG. 1 by at least a factor of 10. FIG. 2 depicts the spectrum of the prior art phase-locked pulse sequence of i1, which contains the harmonics of the reference clock b1 wherein the individual amplitudes decrease only slightly with frequency. FIG. 3 depicts the spectrum of the phase-modulated current pulses of i2 in accordance with the present invention, which as can be seen, differs significantly from the spectrum of FIG. 2. The following three main interdependencies influence this difference:

Regarding the first interdependency when a signal is phase shifted, the least common multiple of the inverse delays of all existing delays Δt determines at what frequency the entire spectrum reoccurs. If there is no such common multiple, this corresponds to the ideal case in which the spectrum does not recur at all. This case is approximately attainable only with a random-signal source whose output signal is analog periodic noise signal, which controls a phase modulator with an infinitely fine time resolution.

Figure 5:
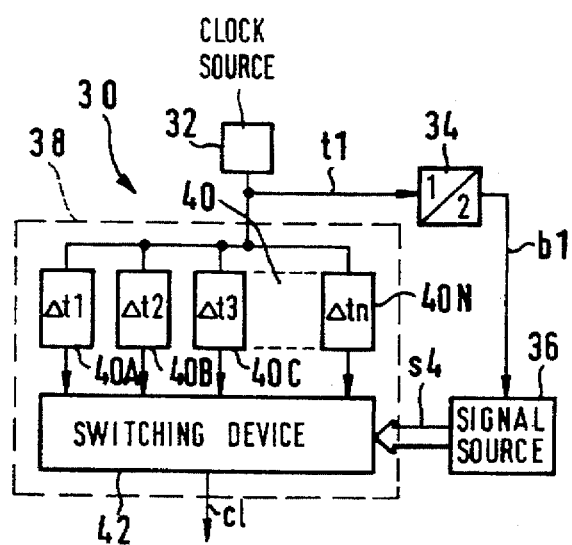
FIG. 5 is a block diagram of a second embodiment of the clock generator according to the present invention.
Figure 6:
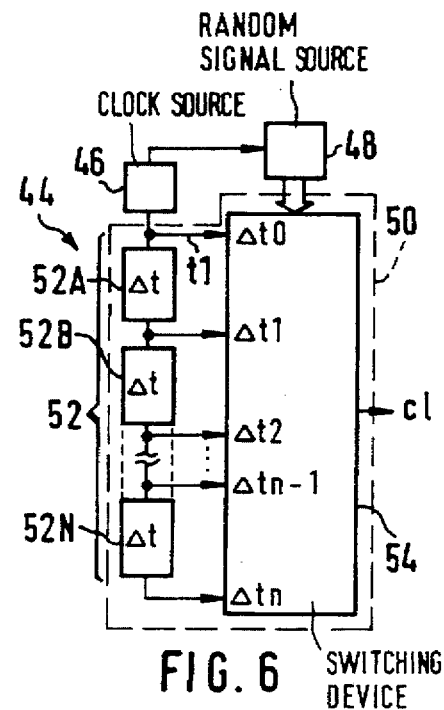
FIG. 6 is a block diagram of a third embodiment of the clock generator according to the present invention.

For practical applications, however, it is sufficient if the spectrum recurs, or is mirrored, only from a sufficiently high frequency f. The inverse value 1/f of this frequency provides a time interval Δt=1/f which represents the associated smallest quantization step for all phase shifts. The smallest quantization step Δt preferably is equal to less than one tenth of the period T of the reference clock signal. This time interval Δt is especially easy to implement with a switched delay device e.g., a delay network as shown in FIG. 5 or FIG. 6. If Δt is in the range of a few nanoseconds, the spectrum will theoretically recur only after several hundred megahertz. As a rule, however, the current-pulse edges are not steep enough for this, so that the interfering spectrum is no longer present at these frequencies. After normalization to the reference period T, the time interval Δt corresponds to the respective phase difference Δφ.

Figure 1:
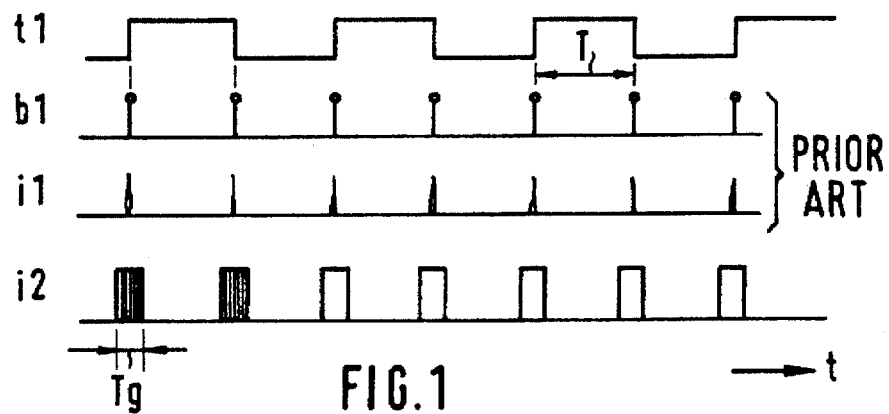
FIG. 1 is a wave form diagram illustrating the temporal relationship between the clock signal, reference clock signal and current pulses over a few clock periods.

In regard to the second interdependency, the ratio of the longest delay Tg/2 to the period T of the reference clock b1 of FIG. 1 determines how much the harmonics in the spectrum are attenuated until they no longer stand out from the uniform noise as discrete spectral lines, thus being no longer identifiable.

The third interdependency relates to the length of the sequence of random numbers without recurrence determines how closely the individual spectral lines are spaced. If the sequence of random numbers has a defined recurrence rate, which is generally the case with digital random-signal generators, it is a pseudo-random number sequence. Since, on the other hand, the temporal length Tn of the pseudo-random number recurrence can be arbitrarily preset via the implementation of the digital random-number generator, the density of the spectral lines can also arbitrarily be preset. As mentioned at the beginning, the number of spectral lines to which the interfering energy can be distributed depends on how many spectral lines are present. A sufficient density of the spectral lines begins approximately with a structure finer than one tenth of the reference-clock period T. This density is obtained by the pseudo random number sequence preferably having a reoccurring period Tn of at least ten times greater than the period T of the reference clock signal b1.

The following example illustrate this point. A clock generator provides a 5-MHz square-wave signal. The positive-going and negative-going pulse edges each trigger a current pulse, so that the current pulses occur at a frequency of 10 MHz. A phase shift is produced by a delay chain consisting of 15 delay stages which each delay the clock pulse by 2 ns. A suitable random-number generator generates a sequence of random numbers with 256 values which recur periodically with a period of Tn=256T. The random number sequence can be read from a table or be generated by means of a pseudo-random number generator. This example results in a spectrum having a density of spectral lines of about 40 kHz. If the random number sequence were 10 times as long, the individual spectral lines would only be spaced approximately 4 kHz apart.

With the above three interdependencies in mind, the clock generator circuit of the present invention will now be discussed.

Figure 4:
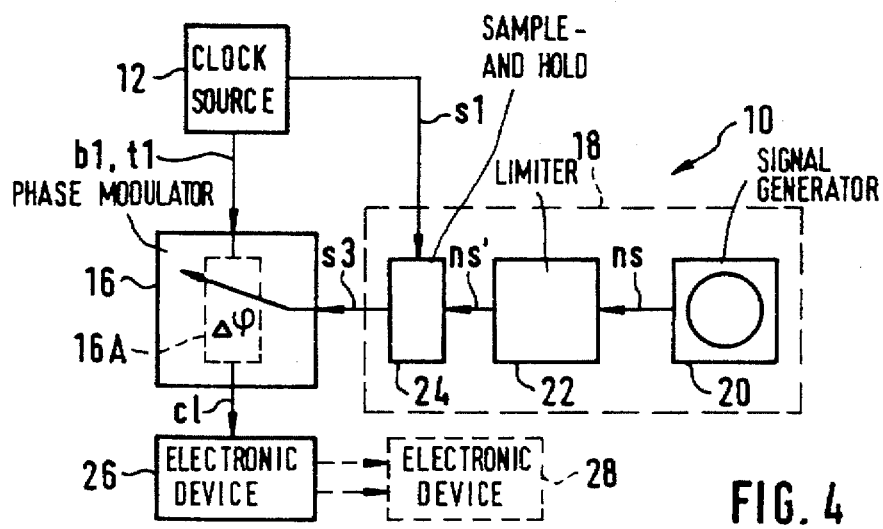
FIG. 4 is a block diagram of a first embodiment of the clock generator according to the present invention.

Referring to FIG. 4, there is shown a first embodiment of the clock generator circuit 10. The circuit 10 includes a clock source 12 for generating a basic clock signal t1. The clock source 12 defines a reference clock signal b1 via the sequence of associated current pulses i1. The clock source 12 is coupled to a phase modulator 16, which phase modulates the basic clock t1 to generate a desired system clock c1. Coupled to the phase modulator 16 is a signal source 18, which provides a control signal s3. The system clock c1 is applied to at least one clock-controlled electronic device 26, e.g., a processor, which produces current pulses i2 that do not interfere with the operation of an adjacently located electronic device 28.

The phase modulator 16 includes a variable delay device 16A which delays the basic clock t1 by different time intervals depending on the value of a control signal s3. The variable delay device 16A may be, for example, an analog delay chain consisting of series-connected inverters whose delay is dependent on the control signal s3.

The signal source 18 includes a random-signal generator 20, which provides at its output, a noise signal ns. Coupled to the random signal generator 20 is a limiter circuit 22, which limits the amplitude of noise signal ns. The limiter 22 is necessary if the random-signal generator 20 is not limited in output amplitude, because unlimited amplitudes can result in excessive phase differences. The output of the limiter 22 is a filtered noise signal ns', which is applied to the input of a sample-and-hold circuit 24. The sample-and-hold circuit 24 prevents any change in the control signal s3 during the reference-clock period T. The control signal s1 which is applied to the sample-and-hold circuit 24, is either the basic clock signal t1 from the clock source 12 or a signal locked thereto.

As stated earlier with respect to the second interdependency it follows that the longest delay $Tg/2$ must have a given relationship to the period T of the reference clock b1, because this determines how much the harmonics of the reference clock b1 are attenuated. From this consideration it follows that the maximum value $Tg/2$ of the phase difference must not exceed a given value of the period T of the reference clock b1. As a rule, this value lies between 2% and 20% of the period T, but should not exceed T/2.

Referring again to FIG. 1, the first line shows the square-wave basic clock t1 from the clock source 12 (FIG. 1). Since a current pulse i1 is triggered on each positive-going edge and negative-going edge of the basic clock t1, a reference clock b1 of twice the frequency of the basic clock signal t1 is obtained for the spectrum of the interference pulses.

In the fourth line, a time window Tg in which the phase-modulated current pulses i2 can occur is shown for each reference-clock period T. One-half of the value of the time window Tg corresponds to the maximum phase difference between the system clock c1 and the reference clock b1. The time duration of the current pulses is not changed by the phase modulation.

Referring to FIG. 5, there is shown a second embodiment of the clock generator of the present invention designated by numeral 30. The second embodiment is similar to the first embodiment, except that it is implemented digitally. The clock generator 30 includes a clock source 32 which provides a basic clock signal t1.

Coupled to the clock source 32 is a phase modulator 38, which is a variable delay device consisting of a predetermined number of digitally controlled delay stages 40A, 40B,40C, . . . ,40N. The digitally controlled delay stages 40A, 40B, 40C, . . . ,40N, produce quantized phase differences $\Delta t1$, $\Delta t2$, $\Delta 3$, . . . , $\Delta tn$, which has a resolution dependent on the smallest quantization step of the possible phase differences. The phase modulator 38 thus operates digitally, which produces a given number of phase differences which differ by the respective number of phase-differences steps $\Delta t$. The phase-difference step $\Delta t$ may be formed, for example, by the propagation delay through a single inverter stage or, to avoid signal inversion, a double inverter stage which forms part of a delay chain consisting of series-connected inverter stages. As is well known, the propagation delay through such inverter stages can be set within a wide range via the shunt current, manufacturing process or temperature induced delay deviations, which can be compensated for by means of a control circuit.

The amount the phase modulator 38 delays the basic clock signal t1 is determined by a digitally controlled switching device 42. The switching device 42 has a number of inputs that are each coupled to a respective output of one of the delay stages 40A, 40B, 40C, . . . ,40N. Each one of the delay stages 40A, 40B, 40C, . . . ,40N also has input, which are all coupled to the clock source 32. In response to a digital control signal s4, a predetermined number of the inputs of the switching device 42 are connected to an output of the switching device 42 to provide the system clock c1.

Further coupled to the switching device 42 is a digital random signal source 36, which controls the switching device 42. The random signal source 36 provides the digital control signal s4, which consists of discrete random-number values. The random-number values are, as a rule, formed by a pseudo-random number sequence from a pseudo-random number generator as is described, for example, in the above-mentioned DE-A-44 23 074. It is also possible, however, to store the pseudo-random number sequence as a table which is read from by the random-number generator. The recurrence rate of the pseudo-random number sequence is arbitrarily predetermined by the length of the table or by the number of shift-register stages in the pseudo-random number generator.

The random-number generator 36 is controlled by the reference clock b1, which is obtained by doubling the basic clock rate t1 by means of a clock-rate-doubling circuit 34.

Referring to FIG. 6, a third embodiment of the clock generator of the present invention is shown as designated by numeral 44. The clock generator 44 is implemented digitally similar to the second embodiment, however the clock generator 44 has a differently configured delay network 52. The delay network 52 consists of a predetermined number of delay stages 52A, 52B . . . 52N in a series configuration coupled to a clock source 46, wherein each delay stage provides an equal delay $\Delta t$. The delay network 52 further includes respective taps which couple the clock source 46 and the outputs of each of the delay stages 52A,52B . . . 52N to an associated input of an electronic switching device 54. In response to a digital control signal s4, a predetermined number of the inputs of the switching device 42 are connected to an output of the switching device 42 to provide the system clock c1.

Each delay stage 52A,52B . . . 52N contains an even number of series-connected inverters, particularly two, the even number serving to prevent an inversion of the clock signal. The design of the delay device as an inverter chain is particularly advantageous for the circuit layout on a semiconductor chip, since the delay stages 52A,52B . . . 52N are equal area circuit structures that are easily combined in one unit. The individual transistors of the switching device 54 preferably are connected to the taps of the delay chain 52 by short signal lines.

A relatively compact arrangement of the delay device 52 on the semiconductor surface is important to ensure that the time resolution of the system clock c1 is dependent only on the respective tap, not on the interference-signal edges coupled therein. The smallest quantization steps, and thus the fine structure of the phase differences $\Delta t$ and $\Delta \phi$, must be very small compared with the period T of the reference clock b1. To attain the object of the invention, it is further necessary that the phase shift follows only the random number, not an interference signal, which would then appear in the noise spectrum as an emphasized signal.

As can be seen by referring again to FIG. 2, the frequency spectrum of the phase-locked current pulses i1 of the prior art contain discrete spectral lines which begin with the frequency f1 of the reference clock b1 and extend over a plurality of frequency multiples of f1. The amplitudes of the spectral lines decrease with increasing frequency. According to fourier theory, this depends on the mark/space ratio and the steepness of the current-pulse edges. This interdependence is indicated schematically as an arrow f(i) which influences the decrement. In an assumed frequency range fb the amplitudes of the spectral components are still relatively large, so that the operation of other electronic equipment picks up interference signals in this frequency range.

In contrast the frequency spectrum of the phase shifted current pulses i2 of the present invention as shown in FIG. 3 include a frequency range k1 where it can be seen that the decrease in the frequency multiples of the system clock c1, which occur at multiples of the reference-clock frequency f, is considerably greater than in the spectrum of FIG. 2. In the frequency range k2, the spectrum of the frequency range k1 recurs at the frequency fw, which extends symmetrically toward higher and lower frequencies. The position of this frequency fw, as discussed in regard to the first interdependency, depends on the least common multiple of the inverse delays, i.e., on the smallest delay step $\Delta t$. This frequency fw, and hence the entire frequency range k2, should be so high that the critical frequency range fb is no longer effected.

According to the second interdependency as previously discussed, the attenuation of the harmonics in the frequency range k1, and thus also in the frequency range k2, depends on the ratio of the longest delay Tg/2 to the period T of the reference clock b1. If the ratio is large enough, the amplitude of the fundamental which is located at the reference clock signal frequency f appears in the uniform noise level pn. For the sake of clarity, this state is not shown in FIG. 3.

In the clock generator of the present invention, the entire energy of the interfering spectrum is distributed as evenly as possible to a plurality of frequencies which lie in the frequency ranges k1, k2, and k3. The amplitudes of the individual components form the uniform noise level pn, whose envelope is shown schematically in FIG. 3 as a dash-and- dot line pn. The more closely the spectral lines are spaced, the lower the noise level pn will be, because the energy can be distributed to a greater number of spectral components. The density of the spectral lines according to third interdependency, is determined by the temporal length Tn of the pseudo-random number sequence in relation to the period T of the reference clock b1. The recurrence rate of the pseudo-random number sequence determines the number of spectral lines in the frequency range O to fw, and thus the density of these spectral lines.

Through mathematical simulation, the individual circuit parameters of the clock generators can be readily varied and their effect on the noise spectrum F(i2) and the useful-signal range fb investigated. Thus, optimum circuit parameters can be found which provide the desired interference suppression. The degree of similarity between actual interference suppression and simulation is very high, particularly if the clock generator is largely implemented as a digital circuit.

While the invention has been particularly shown and described with reference to preferred embodiments thereof, it will be understood by those skilled in the art that changes and/or additions in form and details may be made therein without departing from the spirit and scope of the present invention. Such additions may include passive shielding or reducing the edge steepness of the clock pulses which provides further interference suppression.

Any and all such changes or additions are intended to be included within the scope of the invention as defined by the appended claims.

What is claimed is:

1. A clock generator circuit for clock controlled electronic devices which produces a system clock signal that causes minimal electromagnetic interference in adjacently located electronic equipment, comprising:
  a clock source for generating a basic clock signal having a predetermined frequency which defines a reference clock signal having a period T;
  clock rate doubling means coupled to said clock source, for providing said reference clock signal with a frequency that is twice said predetermined frequency of said basic clock signal;
  a phase modulator coupled to said clock rate doubling means, for delaying said basic clock signal to produce said system clock signal; and
  a signal source coupled to said phase modulator for controlling said phase modulator so that said system clock signal is delayed with respect to said reference clock signal by a time period less than half of said period T of said reference clock signal.

2. The circuit of claim 1, wherein said signal source includes a random signal generator.

3. The circuit of claim 2, wherein said signal source includes a sample and hold circuit coupled between said random signal generator and said phase modulator.

4. The circuit of claim 3, wherein said sample and hold circuit is further coupled to said clock source.

5. The circuit of claim 3, wherein said signal source further includes a limiter circuit coupled between said random signal generator and said sample and hold circuit.

6. The circuit of claim 2, wherein said random signal generator has an analog output.

7. The circuit of claim 6, wherein said phase modulator is a variable analog delay circuit.

8. The circuit of claim 2, wherein said random signal generator has a digital output and is controlled by said reference clock signal.

9. The circuit of claim 8, wherein said digital output includes discrete random number values formed by a pseudo random number sequence.

10. The circuit of claim 9, wherein said pseudo random number sequence has a reoccurring period Tn, wherein said period Tn is a time period which is at least ten times greater than said period T of said reference clock signal.

11. The circuit of claim 8, wherein said phase modulator is a digitally controlled delay circuit that produces a quantized phase delay having a quantization step which is less than one tenth of said period T of said reference clock signal.

12. The method of claim 11, wherein said digitally controlled delay circuit includes a digital controller coupled to a plurality of delay stages, each delay stage producing a delay equal to said quantization step, said digital controller further coupled to said random generator.

13. The device of claim 12, wherein each delay stage has an input coupled to said clock source and an output coupled to an associated input of said digital controller, whereby said digital controller produces a delay in said basic clock signal by coupling a predetermined number of said associated inputs of said digital controller to an output of said digital controller according to said digital output of said random signal generator.

14. The device of claim 12, wherein said plurality of delay stages are in a series configuration coupled to said clock source, said clock source and an output of each said plurality of delay stages are further coupled to an associated input of said digital controller, whereby said digital controller produces a delay in said basic clock signal by coupling a predetermined number of said associated inputs of said digital controller to an output of said digital controller according to said digital output of said random signal generator.

15. A method for producing a system clock signal for clock controlled electronic devices, which causes minimal electromagnetic interference in adjacently located electronic equipment, comprising the steps of:

generating a basic clock signal having a predetermined frequency;

defining a reference clock signal having a period T from said basic clock signal;

causing said reference clock signal to have a frequency which is twice said predetermined frequency; and delaying said basic clock signal by a time period approximately equal to less than half of said period T of said reference clock signal.

16. The method of claim 15, wherein said reference clock signal is delayed by an analog delay circuit.

17. The method of claim 15, wherein said reference clock signal is delayed by a digitally controlled delay circuit.

18. The method of claim 17, wherein said digitally controlled delay circuit produces a quantized phase delay having a smallest quantization step which is less than one tenth of said period T of said reference clock signal.

19. The method of claim 15, wherein said step of generating a basic clock signal is performed by a clock source and said step of causing said reference clock signal to have a frequency which is twice said predetermined frequency is performed by clock rate doubling means coupled to said clock source.

* * * * *